(12) United States Patent
Roohparvar et al.

(10) Patent No.: US 6,584,025 B2
(45) Date of Patent: Jun. 24, 2003

(54) READ COMPRESSION IN A MEMORY

(75) Inventors: Frankie F. Roohparvar, Milpitas, CA (US); Dean Nobunaga, Sunnyvale, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/957,733

(22) Filed: Sep. 21, 2001

(65) Prior Publication Data

US 2002/0044487 A1 Apr. 18, 2002

Related U.S. Application Data

(63) Continuation of application No. 09/651,641, filed on Aug. 30, 2000, now Pat. No. 6,307,790.

(51) Int. Cl.⁷ .................................................. G11C 7/00
(52) U.S. Cl. ................................. 365/201; 365/189.05
(58) Field of Search .......................... 365/201, 189.05, 365/230.08, 233, 189.01; 714/718, 720

(56) References Cited

U.S. PATENT DOCUMENTS

| | | | |
|---|---|---|---|
| 5,041,886 A | 8/1991 | Lee | |
| 5,463,581 A | 10/1995 | Koshikawa | |
| 5,537,354 A | 7/1996 | Mochizuki et al. | |
| 5,600,605 A | 2/1997 | Schaefer | |
| 5,666,321 A | 9/1997 | Schaefer | |
| 5,751,039 A | 5/1998 | Kauffman et al. | |
| 5,787,097 A | * 7/1998 | Roohparvar et al. | ........ 365/201 |
| 5,787,457 A | 7/1998 | Miller et al. | |
| 5,913,928 A | 6/1999 | Morzano | |
| 5,936,903 A | 8/1999 | Jeng et al. | |
| 5,995,438 A | 11/1999 | Jeng et al. | |
| 6,016,561 A | 1/2000 | Roohparvar et al. | |
| 6,026,465 A | 2/2000 | Mills et al. | |
| 6,137,133 A | 10/2000 | Kauffman et al. | |
| 6,141,247 A | 10/2000 | Roohparvar et al. | |
| 6,163,863 A | * 12/2000 | Schicht | ........................ 365/201 |
| 6,356,487 B1 | * 3/2002 | Merritt | .................. 365/189.05 |

OTHER PUBLICATIONS

Keeth, et al., "DRAM circuit design: a tutorial," IEEE Press, 2001, pp. 16–23, 142–153.
Micron Semiconductor Products, Inc., "2Mb, Smart 5 BIO-S–Optimized Boot Block Flash Memory," *Flash Memory* www.micron.com, copyright 2000, Micron Technology, Inc., pp. 1–12.
Micron, "16 Mb: x16 SDRAM" *Synchronous DRAM*, www.micron.com, copyright 1999 Micron Technology, Inc., pp. 1–51.

* cited by examiner

*Primary Examiner*—Richard Elms
*Assistant Examiner*—Anh Phung
(74) *Attorney, Agent, or Firm*—Leffert Jay & Polglaze P.A.

(57) ABSTRACT

A memory device has multiple selectable read data paths. Some of the read data paths include compression circuitry to compress data and decrease test time by testing multiple memories in parallel and/or multiple array banks from the same memory in parallel. A non-compression read path is provided to by-pass the compression circuitry. During memory read operations, therefore, data can be coupled to output buffers without being subjected to delays through a compression circuit. A first compression path can be selected to couple 16 bits from 1 memory array bank to 4 output connections. A second compression path can be selected to couple 64 bits from 4 memory array banks to 4 output connections.

11 Claims, 11 Drawing Sheets

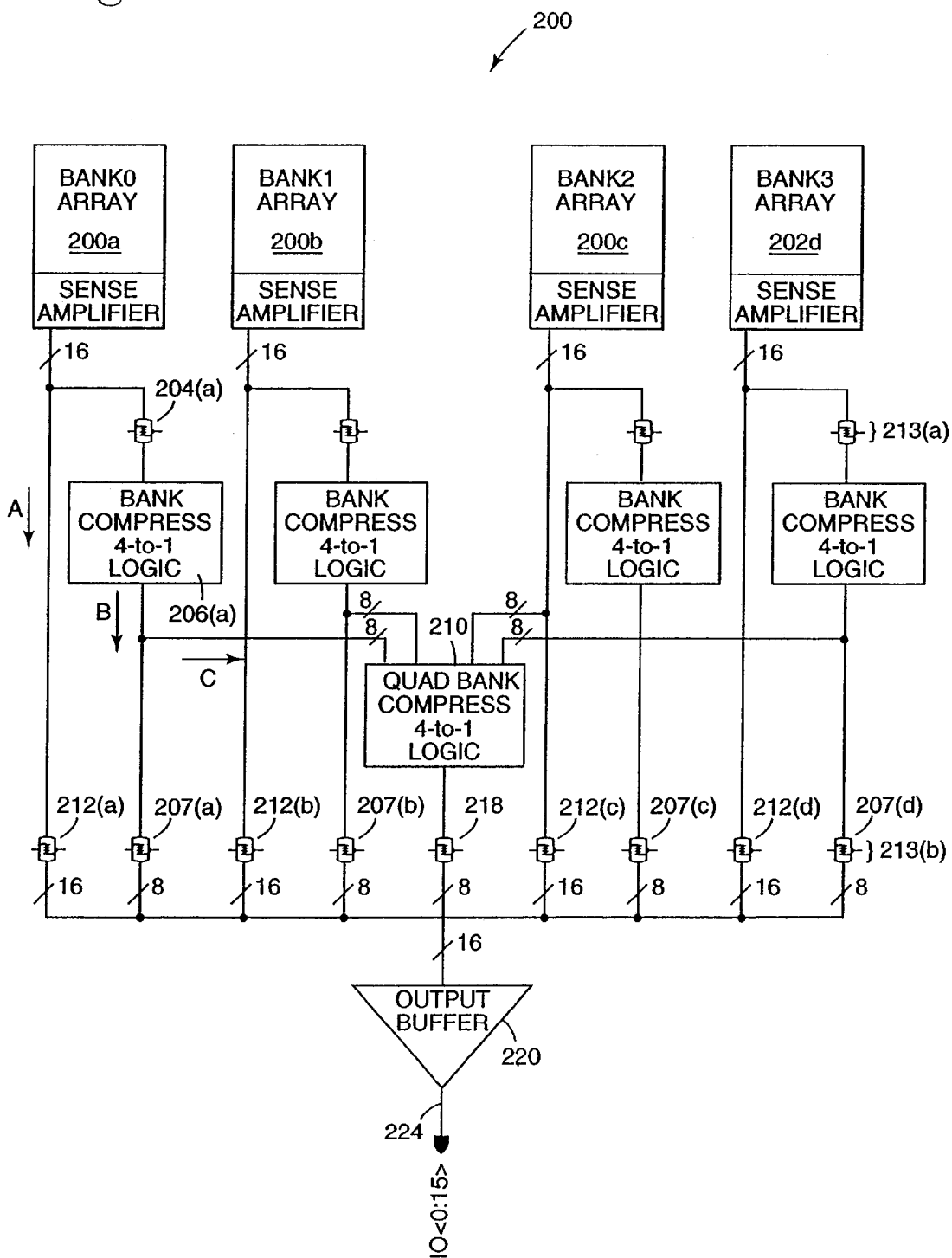

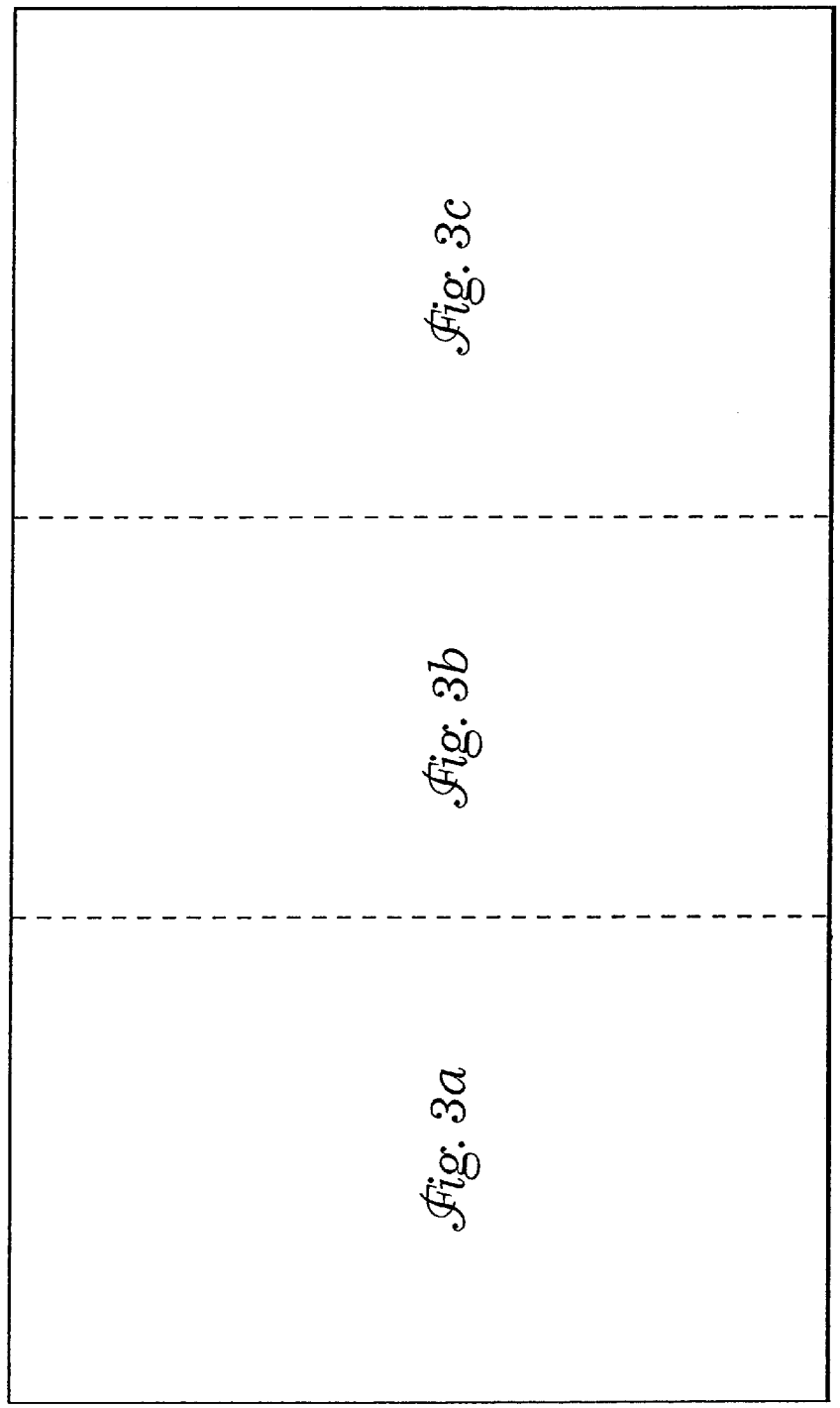

READ COMPRESSION IN A MEMORY

This application is a Continuation of U.S. Pat. No. 09/651,641, filed Aug. 30, 2000 now U.S. Pat. No. 6,307,790.

TECHNICAL FIELD OF THE INVENTION

The present invention relates generally to memory devices and in particular the present invention relates to read data paths in a memory device.

BACKGROUND OF THE INVENTION

Integrated circuit memory devices typically include one or more arrays of memory cells that store data. The data is either read from or written to the memory cell using data communication connections. Some example memory devices include but are not limited to random access memories (RAM), dynamic random access memories (DRAM), Synchronous DRAM (SDRAM), static RAM (SRAM), and non-volatile memories such as FLASH.

During production of the memory devices, the individual memory cells need to be tested. Thus, data is written to the memory cells and then the data is read from the memory. As the density of the memory arrays increase, the time needed to fully test the memory array also increases.

One technique that can be used to decrease test time is data compression. That is, data read from multiple memory cells are compressed into a smaller number of data bits. Thus, less data communication connections (DQ's) are required for a given number of memory cells when implementing data compression. The data compression circuitry is included in the memory device and adds overhead to the data read and write paths. This overhead can decrease operating speeds during normal, non-test operations.

For the reasons stated above, and for other reasons stated below which will become apparent to those skilled in the art upon reading and understanding the present specification, there is a need in the art for a memory device having data compression circuitry while maintaining suitable operating speeds during normal, non-test operations

SUMMARY OF THE INVENTION

The above-mentioned problems with memories and other problems are addressed by the present invention and will be understood by reading and studying the following specification.

In one embodiment, a non-volatile flash memory device comprises an array of non-volatile memory cells, a plurality of data output buffers to provide data from the array to external nodes, and control circuitry to control perform test operations on the array and provide compressed output data.

In another embodiment, a memory device comprises a memory array with 4-banks of memory cells arranged in rows and columns, 16-output buffers coupled to the 4-banks to provide data on 16-output nodes, and a first set of data paths coupled between the 4-banks and the 16x-output buffers to couple data from 16-columns of one of the 4-banks to the 16-output buffers. A second set of data paths are coupled between the 4-banks and the 16-output buffers, the second set of data paths comprise compression logic to simultaneously couple 16-columns from the 4-banks to 4 of the 16-output buffers. The embodiment also includes multiplex circuitry coupled to the output buffers and the first and second sets of data paths to selectively couple the first or second data path to the output buffers.

A non-volatile flash memory device of one embodiment comprises an array of non-volatile memory cells, a plurality of data output buffers to provide data from the array to external nodes, and control circuitry to control perform test operations on the array and select an output data path including compression circuitry to provide compressed output data.

A method of operating a memory comprises initiating a test operation, and coupling data from the array to output connections through compression circuitry to provide compressed data.

BRIEF DESCRIPTION OF THE DRAWINGS

FIG. 2 is a block diagram of a portion of a memory according to one embodiment of the present invention;

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Figure 1:
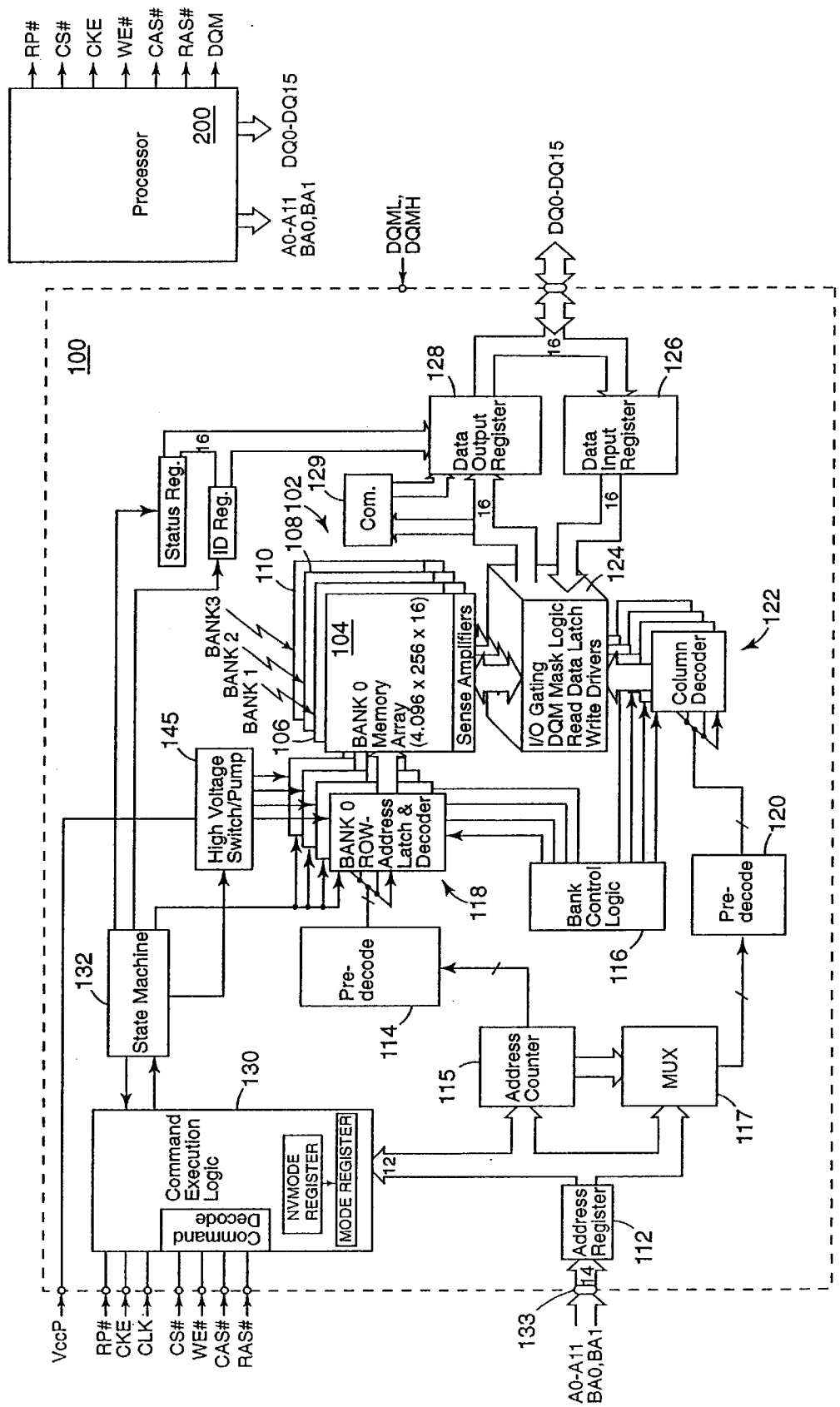
FIG. 1 is a block diagram on asynchronous memory device according to one embodiment of the present invention.

Referring to FIG. 1, a block diagram of one embodiment of the present invention is described. The memory device 100 includes an array of non-volatile flash memory cells 102. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112. The address signals are routed through multiplex circuit 117 to row pre-decode circuitry 114 or column pre-decode circuitry 120. A row decoder 118 and column decoder 122 are provided to identify rows and columns during read and write operations. An address counter circuit 115 allows for internal advancement of address signals. Circuit 124 provides input/output gating, data mask logic, read data latch circuitry and write driver circuitry. Data is input through data input registers 126 and output through data output registers 128. A selectable compression circuit 129 can be used to compress data read from the memory array blocks prior to coupling the data to the output registers/buffers 128 and data output connections, or nodes DQ.

Command execution logic 130 is provided to control the basic operations of the memory device. A state machine 132 is also provided to control specific operations performed on the memory arrays and cells. A status register 134 and an identification register 136 can also be provided to output data. The command circuit 130 and/or state machine 132 can be generally referred to as control circuitry to control read, write, erase and other memory operations.

Prior to describing the operational features of the memory device, a more detailed description of the interconnect pins and their respective signals is provided.

The input clock connection is used to provide a clock signal (CLK). A system clock can drive the clock signal, and all synchronous flash memory input signals are sampled on the positive edge of CLK. CLK also increments an internal burst counter and controls the output registers.

The input command input connections for RAS#, CAS#, and WE# (along with CAS#, CS#) define a command that is to be executed by the memory, as described in detail below. The input/output mask (DQM) connections are used to provide input mask signals for write accesses and an output enable signal for read accesses. Input data is masked when DQM is sampled HIGH during a WRITE cycle.

Address inputs 133 are primarily used to provide address signals. In the illustrated embodiment the memory has 12 lines (A0–A11). Other signals can be provided on the address connections. The address inputs are sampled during an ACTIVE command (row-address A0–A11) and a READ/WRITE command (column-address A0–A7) to select one location in a respective memory bank. The address inputs are also used to provide an operating code during a LOAD COMMAND REGISTER operation. Address lines A0–A11 are also used to input mode settings during a LOAD MODE REGISTER operation.

Bank address input connections, BA0 and BA1 define which bank an ACTIVE, READ, WRITE, or BLOCK PROTECT command is being applied. The DQ0–DQ15 connections 143 are data bus connections used for bi-directional data communication. The VCC connection provides a power supply, such as 3V. A ground connection is provided through the Vss connection. Another optional voltage is provided on the VCCP connection 144. The VCCP connection can be tied externally to VCC, and sources current during device initialization, WRITE and ERASE operations. That is, writing or erasing to the memory device can be performed using a VCCP voltage, while all other operations can be performed with a VCC voltage. The Vccp connection is coupled to a high voltage switch/pump circuit 145.

One embodiment of the present invention is a nonvolatile, electrically sector-erasable (Flash), programmable read-only memory containing 67,108,864 bits organized as 4,194,304 words by 16 bits. Other population densities are contemplated, and the present invention is not limited to the example density. Each memory bank is organized into four independently erasable blocks (16 total).

The synchronous flash memory has a synchronous interface (all signals are registered on the positive edge of the clock signal, CLK). Read accesses to the memory can be burst oriented. That is, memory accesses start at a selected location and continue for a programmed number of locations in a programmed sequence. Read accesses begin with the registration of an ACTIVE command, followed by a READ command. The address bits registered coincident with the ACTIVE command are used to select the bank and row to be accessed. The address bits registered coincident with the READ command are used to select the starting column location and bank for the burst access.

The synchronous flash memory provides for programmable read burst lengths of 1, 2, 4 or 8 locations, or the full page, with a burst terminate option. Further, the synchronous flash memory uses an internal pipelined architecture to achieve high-speed operation.

In general, the synchronous flash memory is configured similar to a multi-bank DRAM that operates at low voltage and includes a synchronous interface. Each of the banks is organized into rows and columns The Mode Register 148 is used to define the specific mode of operation of the synchronous flash memory. This definition includes the selection of a burst length, a burst type, CAS latency, and an operating mode. The Mode Register is programmed via a LOAD MODE REGISTER command and retains stored information until it is reprogrammed. The contents of the Mode Register may be copied into the NVMode Register 147. The NVMode Register settings automatically load the Mode Register 148 during initialization. Details on ERASE NVMODE REGISTER and WRITE NVMODE REGISTER command sequences are provided below. Those skilled in the art will recognize that an SDRAM requires that a mode register must be externally loaded during each initialization operation. The present invention allows a default mode to be stored in the NV mode register 147. The contents of the NV mode register are then copied into a volatile mode register 148 for access during memory operations.

Referring to FIG. 2, a block diagram of selectable read paths from a memory array to output buffer circuitry. The illustrated embodiment 200 has four memory array banks 202(a)–202(d) that are each coupled to data output buffer circuitry 220 via either a direct path A, a first compressed path B or a second compressed path C. The first compressed path B includes compression logic circuitry 206(a)–(d) to compress numerous data bits from an array. In one embodiment, compression logic circuitry 206 has a 4 to 1 compression ratio. Thus, sixteen bits read from memory array 202(a) are compressed into four data bits. The compression logic circuitry 206 also outputs four tri-state control signals to place outputs 224 of the output buffer 220 into a tri-state condition, as explained below.

The second compressed path C includes compression logic circuitry 210 to compress numerous data bits from compression logic circuits 206(a)–(d). In one embodiment, compression logic circuitry 210 has a 4 to 1 compression ratio. Thus, sixteen data bits read from compression logic circuits 206(a)–(d) are compressed into four data bits. The compression logic circuitry 210 also outputs four tri-state signals to place outputs 224 of the output buffer 220 into a tri-state condition, as explained below.

During a read operation, sixteen bits of data are output from a selected memory array bank, such as 202(a), and coupled to output buffers 220 via direct path A selected by activating pass transistors 212(a). Pass transistors 204(a) and pass transistors 207(a) are turned off to isolate data read paths B and C. As such, data read from a memory array bank during a normal data read operation is coupled to output buffers via a direct path without passing through compression circuitry.

During a first test operation, read path B is selectively activated to compress data from one of the four memory array banks. By compressing the data, one memory array bank can be tested through a reduced set of outputs. By selectively activating pass transistors such as 204(a) and 207(a) and turning off pass transistors 212(a) and 218, data read from the memory array is coupled to the output buffer circuitry through data compression circuitry 206(*a*). That is, sixteen bits of data read from one of the four memory array banks (16 bits) can be read through four output buffers. By using only four I/O's per memory device for read/write accesses, four memory devices can be testes in parallel using 16 I/O's. Thus, limited tester resources can be leveraged to test multiple memory devices.

During a second test operation, read path C is selectively activated to compress data from the four memory array banks. By compressing the data, all of the memory array banks can be tested simultaneously to reduce the amount of time required to test the memory array. By selectively activating pass transistors 204(*a*)–(*d*) and 218, and turning off pass transistors 212(*a*)–(*d*) and 207(*a*)–(*d*), data read from the memory array is coupled to the output buffer circuitry through data compression circuitry 206(*a*)–(*d*) and 210. That is, sixteen bits of data read from the four memory array banks (64 bits) can be read through four output buffers. The above described pass transistors can be embodied as multiplexed circuitry generally labeled 213(*a*) and 213(*b*) in FIG. 2.

In summary, a method of operating a memory can comprise initiating a read operation and coupling first data from an array to data outputs through a first data path during the read operation. A test operation is initiated and second data from the array is coupled to the data outputs through a second data path during the test operation. The first and second data paths are coupled in parallel and the second data path comprises compression circuitry. A different test operation can be initiated and data from the array is coupled to the data outputs through a third data path during the test operation. The third data path comprises first and second compression circuits.

The above-illustrated embodiment has a memory array with y-banks 202 of memory cells arranged in rows and columns. The memory includes x-output buffers 220 coupled to the y-banks to provide data on x-output nodes 224. A first set of data paths A are coupled between the y-banks and the x-output buffers to couple data from x-columns of one of the y-banks to the x-output buffers. A second set of data paths B is coupled between the y-banks and the x-output buffers. The second set of data paths includes compression logic 206 to simultaneously couple x-columns from the y-banks to a portion of the x-output buffers. In this embodiment, sixteen columns of data from each of the four memory banks are coupled to four output buffers. Multiplex circuitry 213 is coupled to the output buffers and the first and second sets of data paths to selectively couple the first or second data path to the output buffers.

Figure 3A:
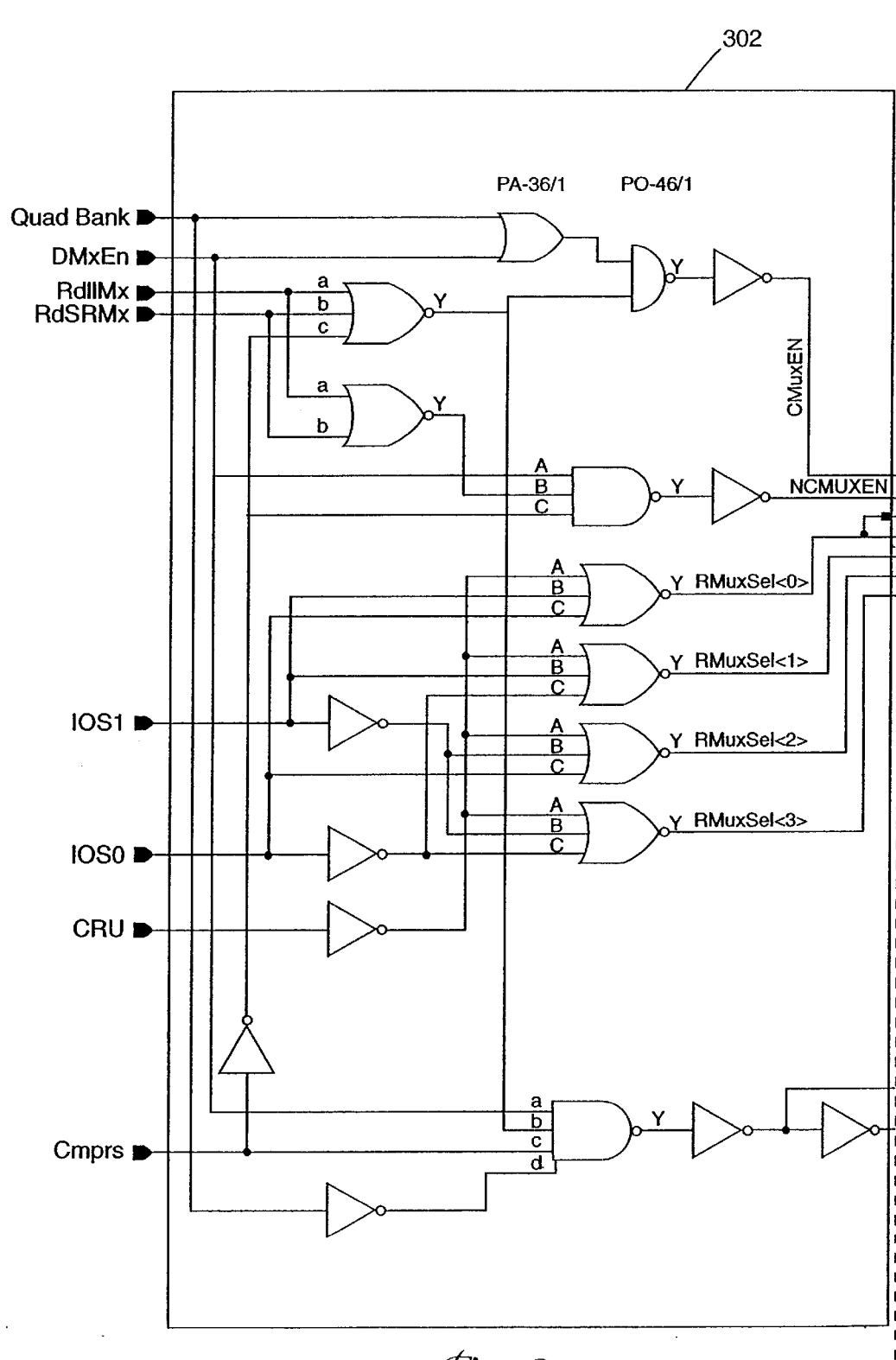
FIGS. 3*a*, 3*b* and 3*c* are a more detailed schematic diagram of a portion of a memory according to one embodiment of the present invention.
Figure 3B:
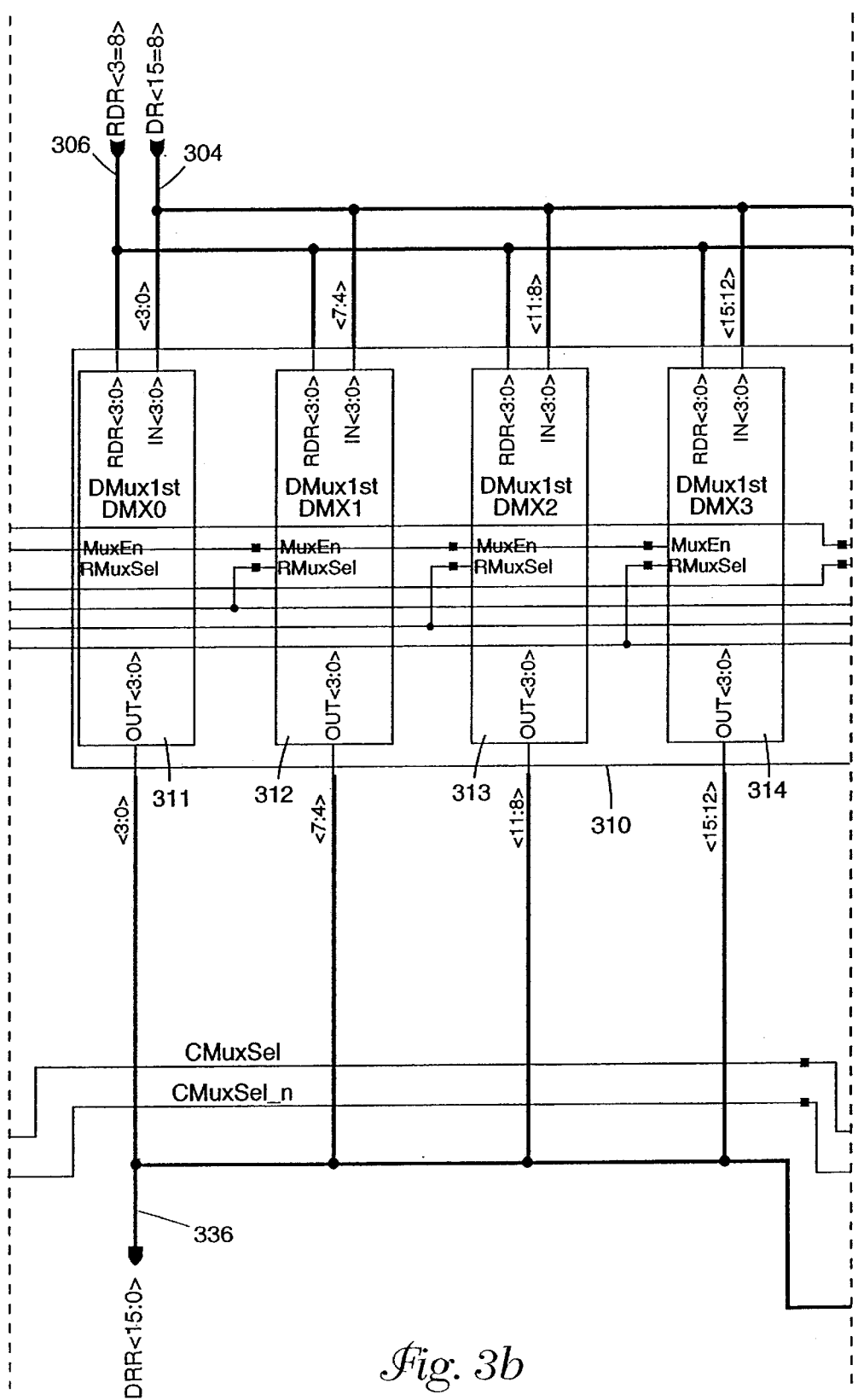
Figure 3C:
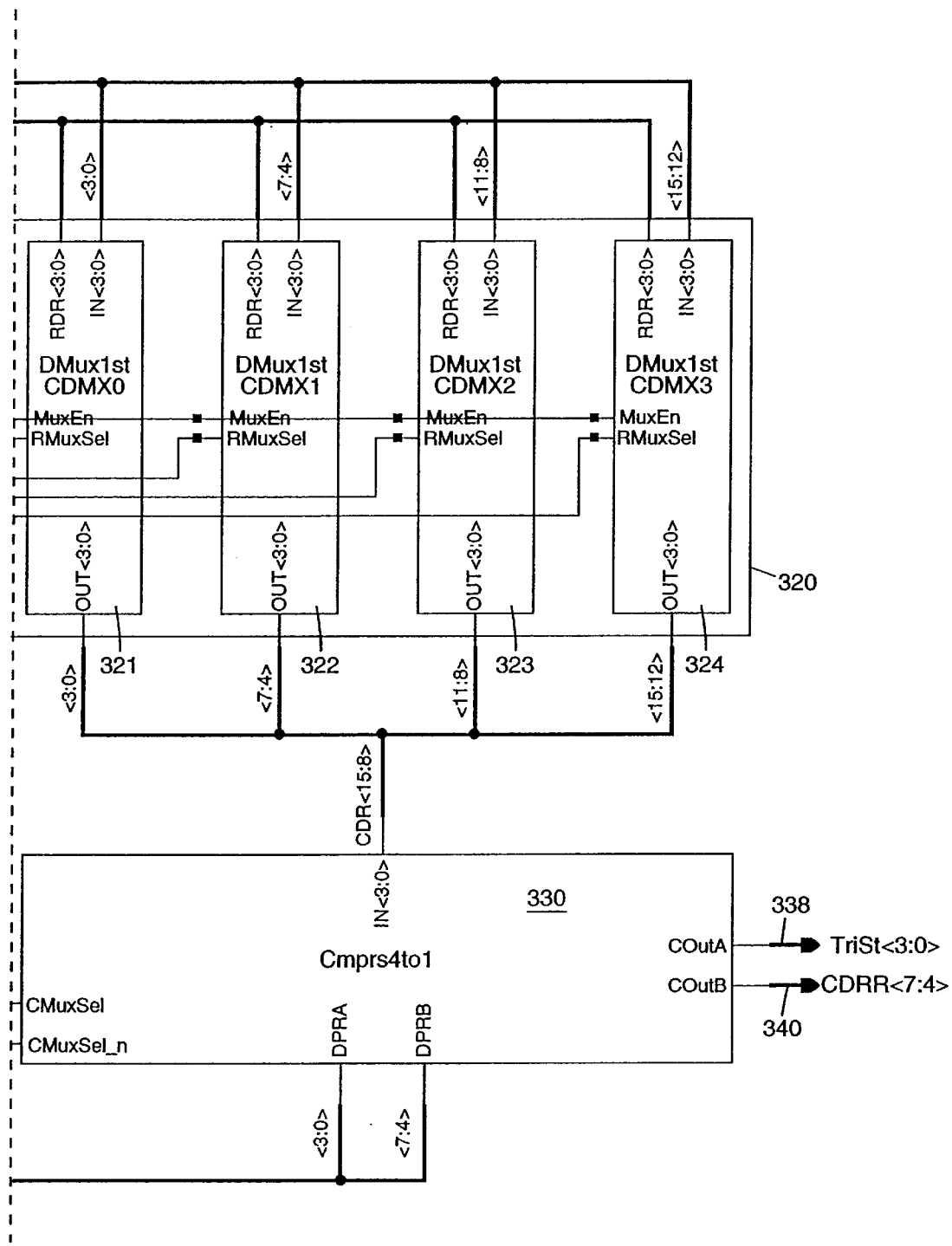

FIG. 3 illustrates an embodiment of data multiplex circuitry 300 of a memory device. The multiplex circuitry includes a first multiplexer 310 to selectively couple either primary data lines 304 or redundant data lines 306 to data output lines 336 that are coupled to output buffers (not shown in FIG. 3). As known to those skilled in the art, redundant data lines provide data from redundant memory cells that allow defective memories to be repaired. The first multiplexer includes four multiplex circuits 311–314 to each selectively couple four data lines from the array to output buffers.

Multiplex circuit 320 includes four multiplexers 321–324 that each couple four data lines from the memory array to compression circuit 330. The compression circuit can output data to either the data output lines 336 or to additional compression circuitry (see FIG. 6) via outputs 338 and 340.

The compressed data is provided on four data outputs 340 and four outputs 338 are used to provide tri-state control signals for the output buffers. Logic circuitry 302 is used to control the multiple circuitry. The details of the illustrated logic circuitry are not described herein, and someone skilled in the art with the benefit of the present description can modify the logic circuit without departing from the present invention. The compression control signal (Cmprs) activates multiplex circuits 311–314 when it is low, and activates multiplex circuits 321–324 when it is high. When the CRU signal is low, primary memory cell data is used and the redundant data is not used. When CRU is high, the redundant data is used. The IOS0 and IOS1 signals define which multiplex circuit uses the redundant data, as shown in Table 1.

TABLE 1

| IOS1 | IOS0 | RDR <3:0> replaces: |
|---|---|---|
| 0 | 0 | 311 or 321 |
| 0 | 1 | 312 or 322 |
| 1 | 0 | 313 or 323 |
| 1 | 1 | 314 or 324 |

Figure 4:
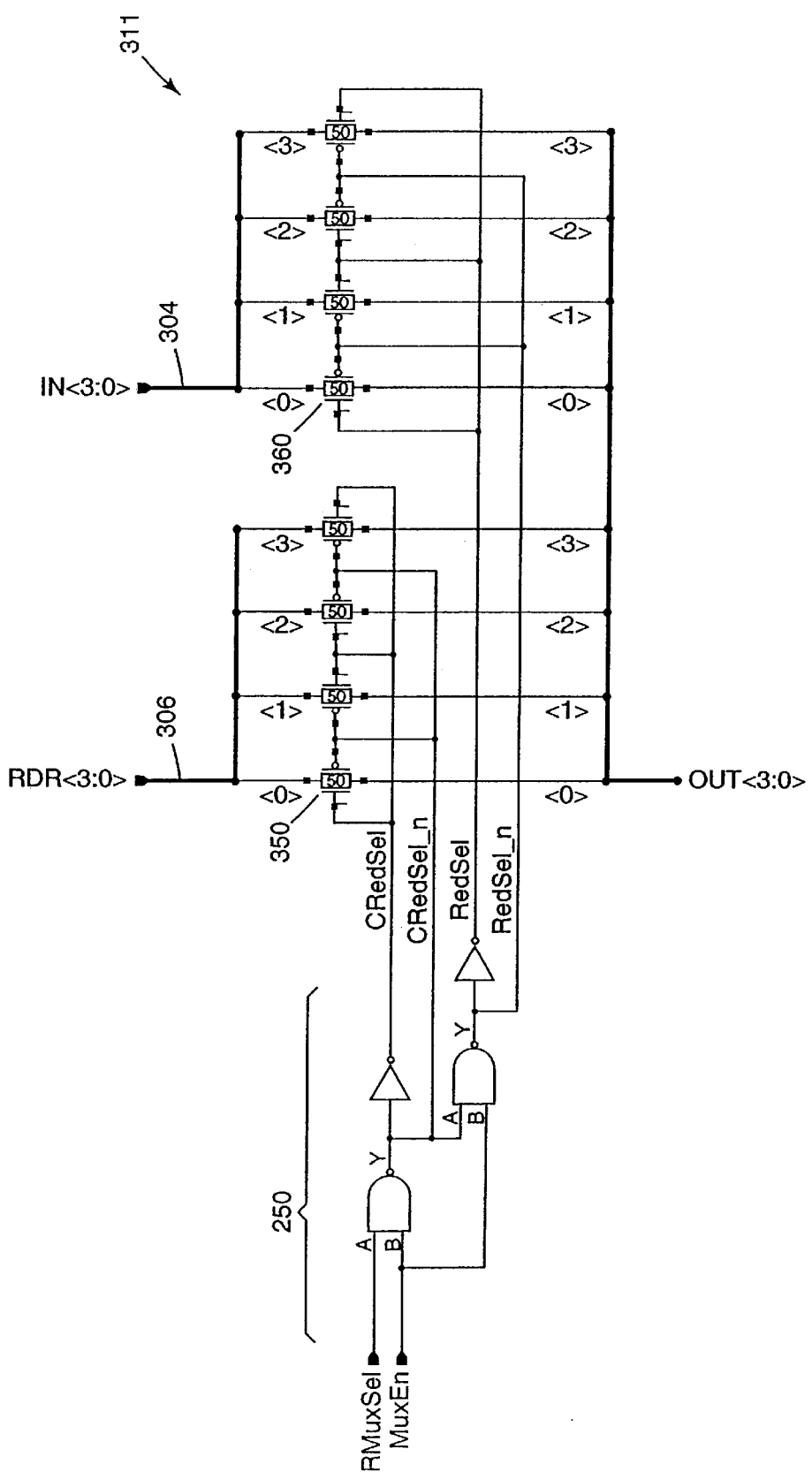
FIG. 4 is a schematic diagram of a multiplex circuit according to one embodiment of the present invention.

Referring to FIG. 4, a detailed schematic is described of one possible embodiment of multiplexer 311. The multiplexer includes four pass circuits 350 that are coupled between the redundant data lines 306 and the output lines 336. Likewise, the multiplexer includes four pass circuits 360 that are coupled between data lines 304 and the output lines 336. The pass circuits are selectively activated using a redundant multiplex select signal (RmuxSel) and a multiplex enable (MuxEn) signal provided by the logic circuitry 302 (FIG. 3).

Figure 5:
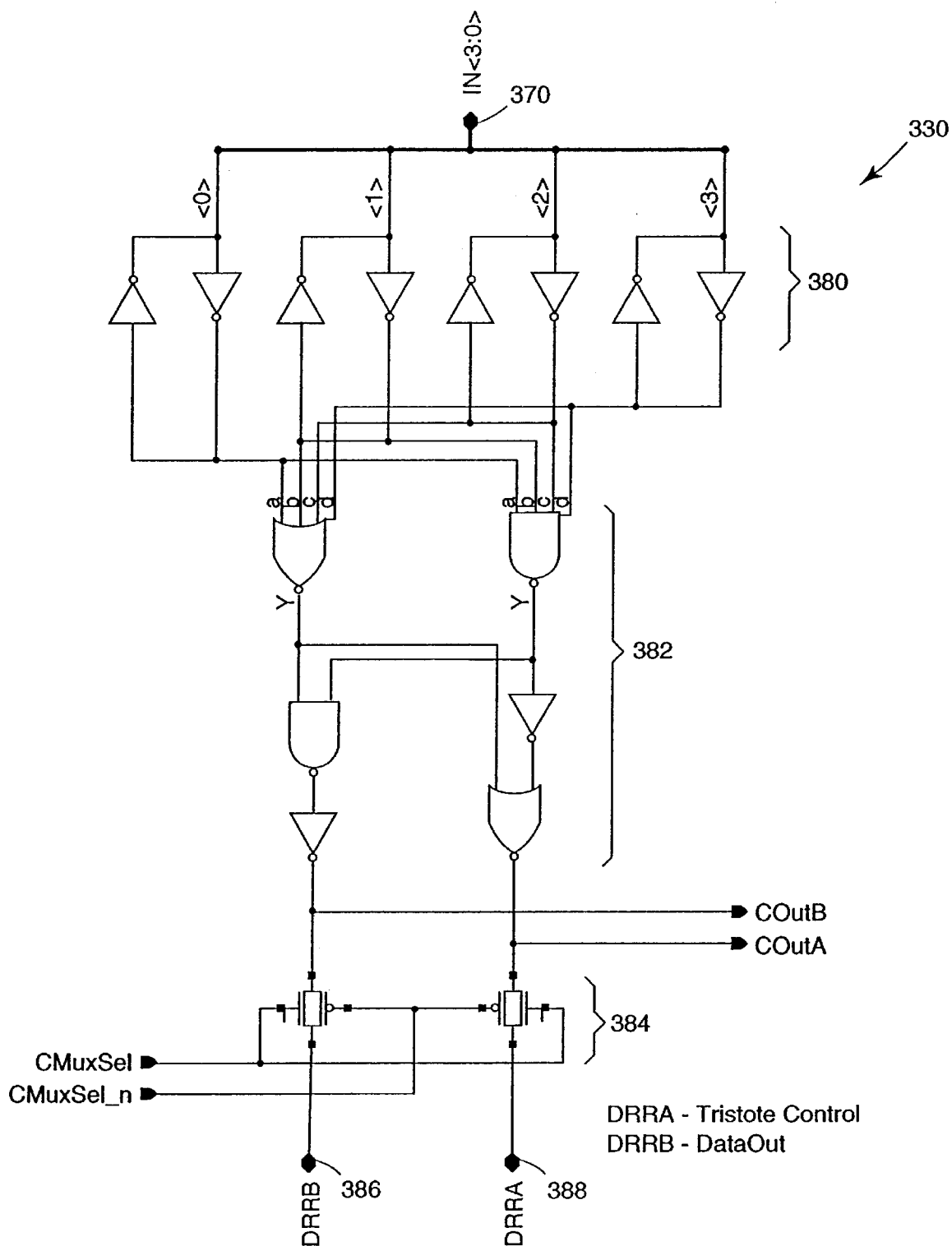
FIG. 5 is a schematic diagram of a compression circuit according to one embodiment of the present invention.

Referring to FIG. 5, a detailed schematic is described of one possible embodiment of compression circuit 330. The compression circuit includes four latches 380 that receive data on inputs 370. The inputs are coupled to multiplex circuits 321–324. Logic circuitry 382 compresses the four latched data signals to one data signal on line 386. The compression circuit also provides a tri-state control signal on line 388. Pass circuitry 384 selectively coupled the data to outputs 386 and 388 in response to control signal CmuxSel and its logical inverse as provided by circuit 302 (FIG. 3). The compression logic provides three possible data states on the output connection based upon the four input data signals. As illustrated in Table 2, the output data states are either a logic one, a logic zero or tri-state.

TABLE 2

| Input Data (bus 370) | Output data signal |
|---|---|
| 0000 | 0 |
| 1111 | 1 |
| 0001, 0010, 0011, 0100, 0101, 0110, 0111, 1000, 1001, 1010, 1011, 1100, 1101, 1110 | Tri-state |

Note that the memory device output I/O has three possible states based upon the data read from the memory array. If all four data bits are a one, the output is a one. If all four data bits are a zero, the output is a zero. If any of the four data bits is different, the output is tri-state. Thus, signals on lines 386 and 388 are used to control the output buffers. That is, one embodiment uses line 386 to drive data from the buffer and line 388 is used to override the data signal and tri-state the buffer. Other compression logic can be used, and the present invention is not limited to the described embodiment.

Figure 6:
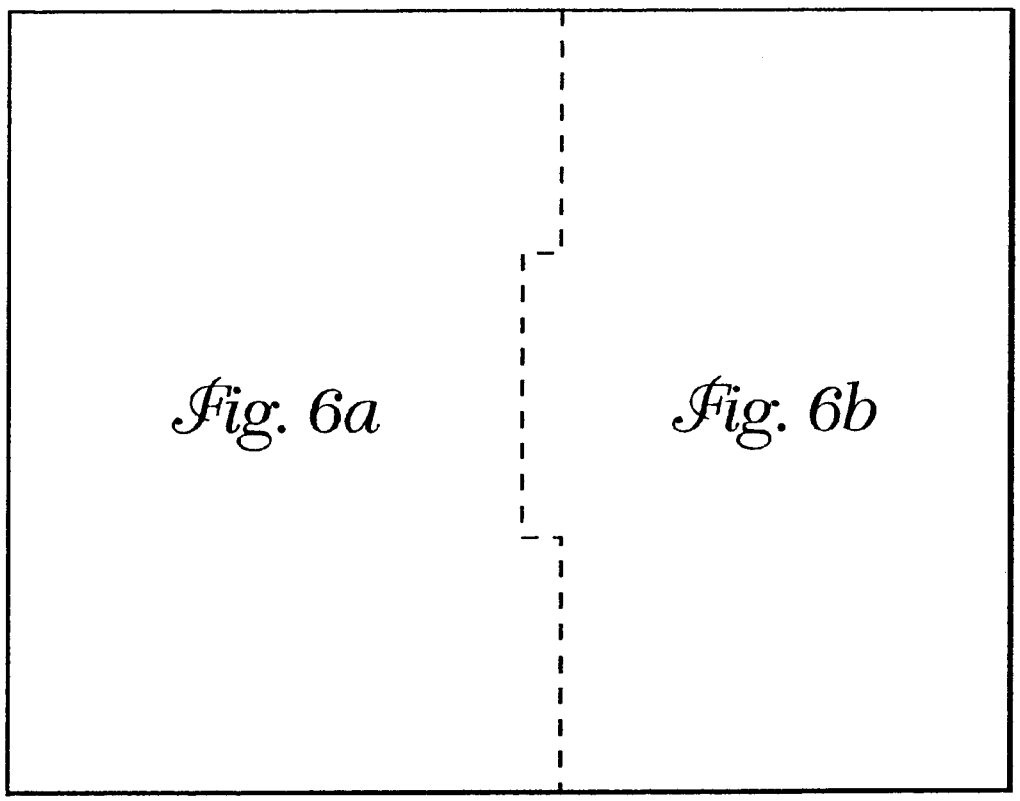
FIGS. 6*a* and 6*b* are a diagram of another multiplex circuit and compression circuit according to one embodiment of the present invention.
Figure 6A:
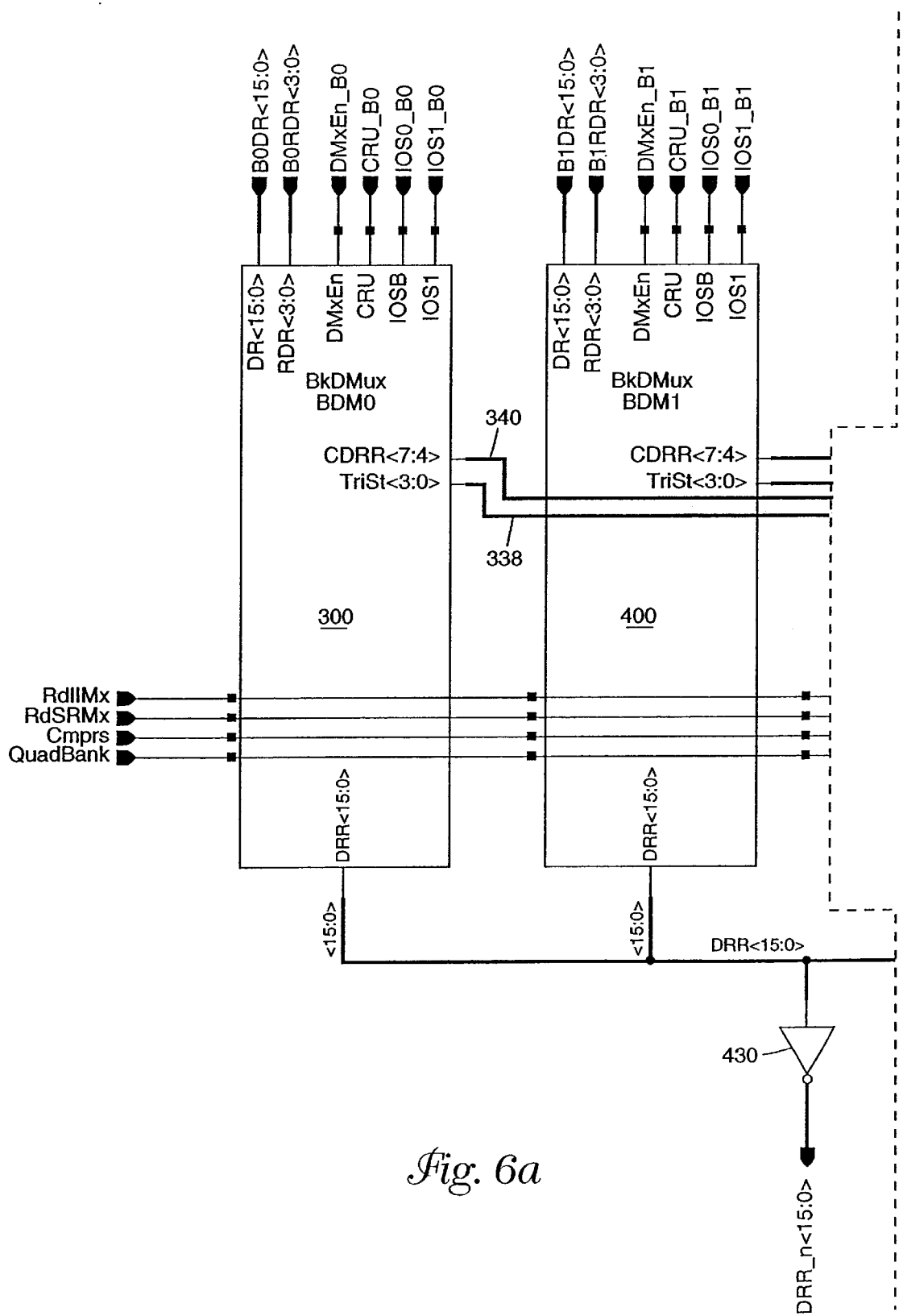
Figure 6B:
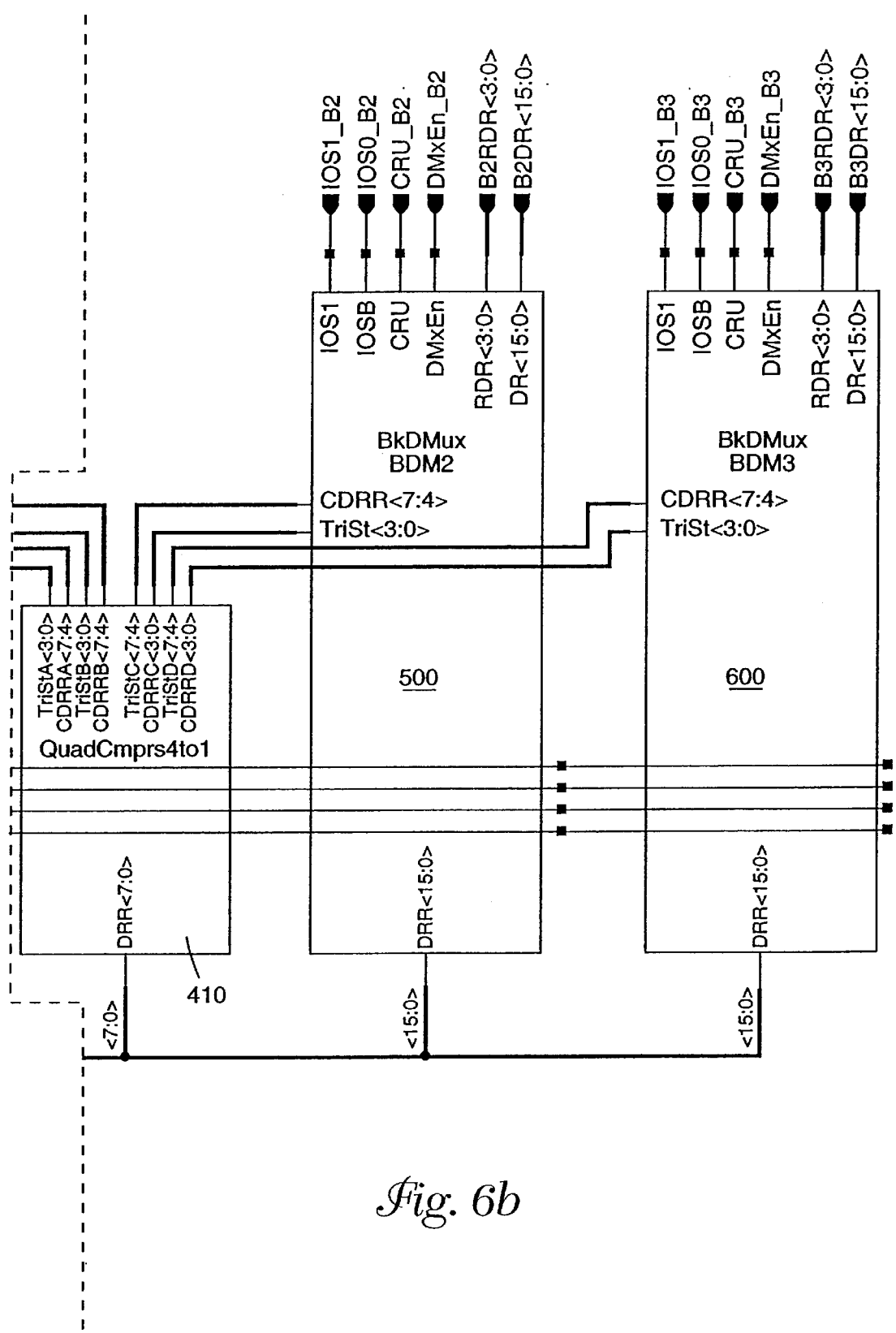

FIG. 6 illustrates four data multiplex circuits 300, 400, 500 and 600 coupled to a 4 to 1 bank compression circuit 410. Compressed data from the four bank multiplex circuits, for example lines 338 and 340 from multiplex 300, are compressed by circuit 410 and coupled to the output buffers 430.

Conclusion

A memory device has been described that has multiple selectable read data paths. Some of the read data paths include compression circuitry to compress data and decrease test time. A non-compression read path is provided to by-pass the compression circuitry. During memory read operations, therefore, data can be coupled to output buffers without being subjected to delays through a compression circuit. A first compression path can be selected to couple 16 bits from 1 memory array bank to 4 output connections. A second compression path can be selected to couple 64 bits from 4 memory array banks to 4 output connections.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A non-volatile flash memory device comprising:
   an array of non-volatile memory cells;
   a plurality of data output buffers to provide data from the array to external nodes;
   control circuitry to select between compressed output data and un-compressed output data; and
   first and second data paths between the array and the plurality of data output buffers, wherein the control circuitry can select the first data path that comprises compression logic to compress the data from the array.

2. The non-volatile flash memory device of claim 1 wherein the second data path is a direct data path without compression logic.

3. A non-volatile flash memory device comprising:
   an array of non-volatile memory cells arranged in rows and columns;
   a plurality of output buffers;
   first and second compression circuitry wherein the first compression circuitry has a 4 to 1 compression ratio to compress 16 data bits from the array to 4 output buffers; and
   control circuitry to select the first and/or the second compression circuitry to output compressed data via the plurality of output buffers.

4. The non-volatile flash memory of claim 3 wherein the second compression circuitry has a 16 to 1 compression ratio to compress 64 data bits from the array to 4 output buffers.

5. A method of operating a memory array comprising:
   initiating a test operation;
   selecting either a compressed data path or an un-compressed data path; and
   coupling data from the memory array to output connections through the selected data path.

6. The method of claim 5 wherein the compression circuitry comprises a 4 to 1 compression circuit.

7. The method of claim 5 wherein the test operation is performed in response to test instructions received on some of the output connections.

8. The method of claim 5 wherein coupling data from the array to output connections comprises selecting first or second compression circuitry.

9. A method of operating a non-volatile flash memory comprising:
   receiving test instructions, including externally provided signals received on data output connections;
   initiating a test operation in response to the test instructions;
   selecting either a first compression circuit having a 4 to 1 compression ratio or second compression circuit having a 16 to 1 compression ratio; and
   coupling data from the array to output connections through the selected compression circuit to provide compressed output test data.

10. An electronic system comprising:
    a processor that generates control signals; and
    a memory device that receives the control signals, the memory device comprising:
      an array of non-volatile memory cells;
      a plurality of data output buffers to provide data from the array to external nodes;
      control circuitry to select between compressed output data and un-compressed output data in response to the control signals; and
      first and second data paths between the array and the plurality of data output buffers, wherein the control circuitry can select the first data path that comprises compression logic to compress the data from the array.

11. The electronic system of claim 10 wherein the control signals include test instructions.

* * * * *